(12) United States Patent
Kim

(10) Patent No.: US 8,410,514 B2
(45) Date of Patent: Apr. 2, 2013

(54) LIGHT EMITTING DEVICE

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 193 days.

(21) Appl. No.: 12/871,346

(22) Filed: Aug. 30, 2010

(65) Prior Publication Data

US 2011/0057209 A1 Mar. 10, 2011

(30) Foreign Application Priority Data

Aug. 31, 2009 (KR) .......................... 10-2009-0081111

(51) Int. Cl.
*H01L 33/00* (2010.01)
(52) U.S. Cl. ........... 257/99; 257/E33.056; 257/E33.057; 257/E33.058; 257/E33.062
(58) Field of Classification Search ........................ None
See application file for complete search history.

(56) References Cited

U.S. PATENT DOCUMENTS

| 5,003,357 | A * | 3/1991 | Kim et al. ..................... 257/98 |
| 2005/0121686 | A1* | 6/2005 | Keller et al. ................... 257/99 |
| 2006/0166477 | A1 | 7/2006 | Wang et al. |
| 2007/0210317 | A1* | 9/2007 | Chou et al. ..................... 257/79 |
| 2008/0290353 | A1* | 11/2008 | Medendorp et al. ............ 257/89 |
| 2009/0021180 | A1 | 1/2009 | Underwood et al. |
| 2010/0006864 | A1* | 1/2010 | Steigerwald .................... 257/88 |

FOREIGN PATENT DOCUMENTS

| JP | 2007-027357 A | 2/2007 |
| KR | 10-2008-0051877 A | 6/2008 |

* cited by examiner

*Primary Examiner* — Benjamin Sandvik
*Assistant Examiner* — Leslie Pilar Cruz
(74) *Attorney, Agent, or Firm* — Birch, Stewart, Kolasch & Birch, LLP

(57) ABSTRACT

Provided are a light emitting device. The light emitting device comprises a package body, an insulating layer on a surface of the package body, first and second electrode layers on the insulating layer, a light emitting diode disposed on the package body and electrically connected to the first and second electrode layers, a resistor layer connected to the first electrode layer, a first element part in a first doping region within the package body, a second element part in a second doping region within the package body, and a third electrode layer connected to the first element part and the second element part.

19 Claims, 11 Drawing Sheets

US 8,410,514 B2

LIGHT EMITTING DEVICE

BACKGROUND

Embodiments relate a light emitting device.

Light emitting diodes (LEDs) may constitute a light emitting source using compound semiconductor materials such as GaAs-based materials, AlGaAs-based materials, GaN-based materials, InGaN-based materials and InGaAlP-based materials.

Such a light emitting device is packaged, and thus is being used as a light emitting apparatus that emits light having various colors. The light emitting apparatus is being used as a light source in various fields, e.g., lighting displays, character displays, and image displays.

SUMMARY

Embodiments provide a light emitting device in which a constant current circuit is integrated with a package body.

Embodiments provide a light emitting device in which a circuit for protecting a light emitting diode is integrated with a conductive package body such as silicon.

In one embodiment, a light emitting device comprises: a package body; an insulating layer on a surface of the package body; first and second electrode layers on the insulating layer, the first and second electrode layers being spaced apart from each other; a light emitting diode disposed on the package body and electrically connected to the first and second electrode layers; a resistor layer connected to the first electrode layer; a first element part in a first doping region within the package body, the first element part being connected to the resistor layer to output a power source inputted from the resistor layer; a second element part in a second doping region within the package body, the second element part being connected to the light emitting diode to output the power source inputted from the resistor layer; and a third electrode layer connected to the first element part and the second element part, the third electrode layer having an electric potential less than those of the first electrode layer and the second electrode layer.

In another embodiment, a light emitting device comprises: a package body; an insulating layer on a surface of the package body; first and second electrode layers on the insulating layer, the first and second electrode layers being spaced apart from each other; an element part in a doping region within the package body, the element part being connected to at least one of the first electrode layer or the second electrode layer; and a light emitting diode disposed on the package body and connected to at least one of the first electrode layer or the second electrode layer, wherein the element part comprises a second conductive type first well and first conductive type second and third wells, which are electrically separated from each other within the first well.

The details of one or more embodiments are set forth in the accompanying drawings and the description below. Other features will be apparent from the description and drawings, and from the claims.

DETAILED DESCRIPTION OF THE EMBODIMENTS

Figure 1:
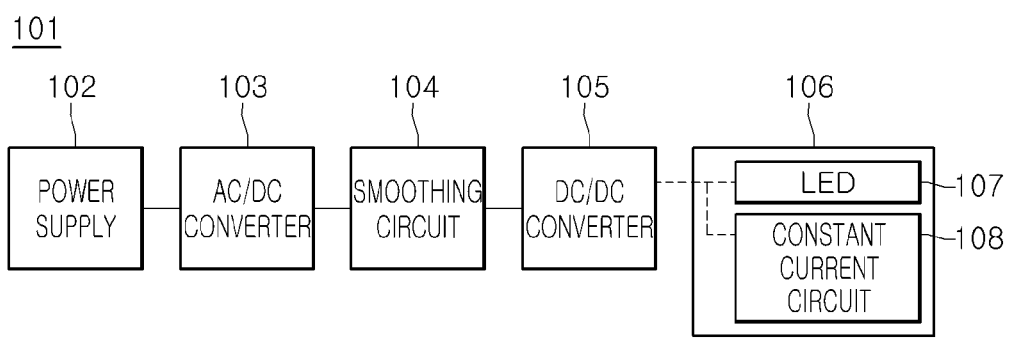
FIG. 1 is a view of a light emitting device driving circuit according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings. Example embodiments will now be described more fully hereinafter with reference to the accompanying drawings. In the drawings, the thickness or size of each layer is exaggerated, omitted, or schematically illustrated for convenience in description and clarity. Also, the size of each element does not entirely reflect an actual size.

Hereinafter, embodiments will be described with reference to the accompanying drawings.

FIG. 1 is a view of a light emitting device driving circuit according to a first embodiment.

Referring to FIG. 1, a light emitting diode (LED) driving circuit 101 includes a power supply 102, an AC/DC converter 103, smoothing circuit 104, a DC/DC converter 105, and a light emitting device 106.

The power supply 102 supplies an alternating current (AC) power to the AC/DC converter 103, and the AC/DC converter 103 converts the AC power into a direct current (DC) power to output the converted DC power. The AC/DC converter 103 may include a bridge rectifier, but is not limited thereto.

An overvoltage protector circuit (not shown) for blocking overvoltage or/and an electromagnetic interference (EMI) filter for interrupting an electromagnetic wave (e.g., an electromagnetic interference) may be disposed at an input terminal of the AC/DC converter 103, but is not limited thereto.

The smoothing circuit 104 removes a ripple of the DC power outputted from the AC/DC converter 103, and the DC/DC converter 105 converts the DC power outputted from the smoothing circuit 104 into a DC power having a level required for loading.

The light emitting device 106 includes a light emitting diode (LED) 107 and a constant current circuit 108. The light emitting diode 107 is turned on/off by the DC power boosted or stepped-down by the DC/DC converter 105. The constant current circuit 108 adjusts current inputted into the light emitting diode 107.

The light emitting diode 107 includes a colored LED chip using a compound semiconductor such as a blue LED chip, a green LED chip, and a red LED chip, or an UV LED chip. The plurality of LED chips may be connected to each other in parallel or series.

The constant current circuit 108 is disposed with a doping region of the light emitting device 106 to regularly adjust the current supplied into the light emitting diode 107. The constant current circuit 108 regularly controls the current applied to the light emitting diode 106 to protect the light emitting diode 108.

Since the constant current circuit 108 is integrated within the light emitting device 106, it may prevent an input voltage from being changed. The constant current circuit 108 may prevent brightness of the light emitting diode 107 from being changed according to an input current and prevent a light intensity of the light emitting diode 107 from being changed according to a change of the input voltage. Also, the constant current circuit 108 may reduce a light intensity deviation of a light emitted from the light emitting diode 107 by a load fluctuation. In addition, the constant current circuit 108 may protect the light emitting diode 107 against the overcurrent.

The constant current circuit 108 includes a circuit device such as a current regulative diode, a filed effect transistor (FET) constant current source, a cascade current source, etc.

Figure 2:
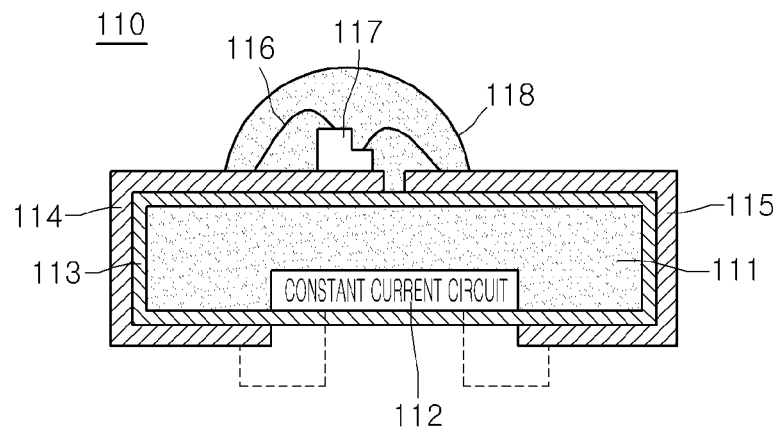
FIG. 2 is a sectional view of a light emitting device according to a second embodiment.

FIG. 2 is a sectional view of a light emitting device according to a second embodiment.

Referring to FIG. 2, a light emitting device 110 includes a package body 111, a constant current circuit 112, an insulating layer 113, a plurality of electrode layers 114 and 115, a light emitting diode 117, and a resin material 118.

The package body 111 may be an N-type substrate, and the substrate may be formed of a silicon material. For example, the substrate may be manufactured as an N-type substrate by diffusing group-V elements or implanting group-V ions. On the other hand, the substrate may be a P-type substrate. For example, the substrate may be formed of a P-type substrate by diffusing group-III element or implanting group-III ion.

A top surface and lower surface of the package body 111 may be planarized, and the outer surface of the package body 111 may be vertical or inclined with respect to the lower surface.

The insulating layer 113 may be disposed on the surface of the package body 111, and the insulating layer 113 may include at least one of $SiO_2$, $Si_3N_4$, $Al_2O_3$ and $TiO_2$. The insulating layer 113 may prevent short between the package body 111 and another layer.

The plurality of electrode layers 114 and 115 may be disposed on the insulating layer 113. The plurality of electrode layers 114 and 115 may be extended from the top surface of the package body 111 to the lower surface of the package body 111.

The elements of the constant current circuit 112 may be integrated into the doping region of the package body 111, and may be selectively connected to the plurality of electrode layers 114 and 115. The elements of the constant current circuit 112 may include a transistor or/and a diode that is integrated into the package body 111.

The elements of the constant current circuit 112 are disposed in the doping regions of the package body 111, and each of the doping regions includes a conductive well. The wells of the doping region may be integrated as wells such as a P-N junction diode, an N-P junction diode, an N-P-N junction transistor and a P-N-P junction transistor. The ground terminal of the doping region may be selectively connected to the electrodes 114 and 115.

The light emitting diode 117 may be disposed on the package body 111, and may be connected to the electrode layers 114 and 115 through a wire 116. The light emitting diode 117 includes a semiconductor material having the composition equation of $In_xAl_yGa_{1-x-y}N$ (where $0 \leq x \leq 1$, $0 \leq y \leq 1$, and $0 \leq x+y \leq 1$). The light emitting diode 127 includes a lateral chip structure or a vertical chip structure. The lateral chip structure is one where different electrodes are disposed next to each other, and the vertical chip structure is one where different electrodes are disposed in the direction opposite to each other.

The light emitting diode 117 may be electrically connected to the electrodes 114 and 115, for example, the light emitting diode 117 may adhere onto the first electrode layer 114 and be connected to the first and second electrode layers 114 and 115 through the wire 116. The light emitting diode 117 may be connected in another scheme, for example, the light emitting diode 117 may use one wire, a flip scheme, or a die bonding scheme.

The doping region of the package body 111 may be disposed at the surface opposite to a surface at which the light emitting diode 117 is disposed.

A resin material 118 is disposed on the light emitting diode 117. The resin material 118 may be formed of a transparent insulating material, for example, epoxy or silicon, and it may be formed in a certain lens shape.

A phosphor may be added to the resin material 118. The phosphor absorbs a portion of light that is emitted from the light emitting diode 117 and emits light having another wavelength. The phosphor, for example, may include any one of a blue phosphor, a green phosphor, a red phosphor or a yellow phosphor, but is not limited thereto.

The shape of the resin material 118 includes a hemisphere shape or a multi-angle shape, but is not limited thereto. A light reflective material may contact a certain portion of the resin material 118.

In the light emitting device 110, the constant current circuit 112 controls a power source that is inputted to the light emitting diode 117, and can decrease the light intensity deviation or brightness change of the light emitting diode 117. Moreover, the constant current circuit 112 can suppress the change of the operation characteristic of the light emitting diode 117.

The constant current circuit 112 is integrated into the light emitting device 110, and thus a light source module can be miniaturized. A constant voltage device such as a Zener diode may be integrated into another doping region of the light emitting device 110, and thus the cost of a light source module can be saved and the number of PCB mounting components can be reduced.

Figure 3:
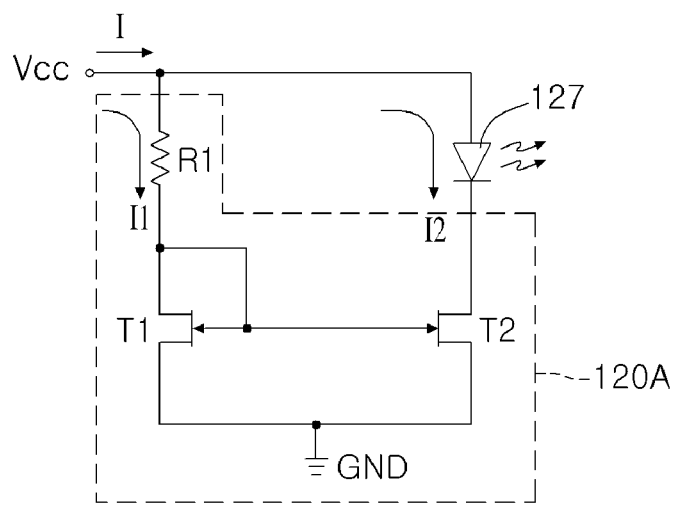
FIG. 3 is a view illustrating a constant current circuit of a light emitting device according to a third embodiment.
Figure 4:
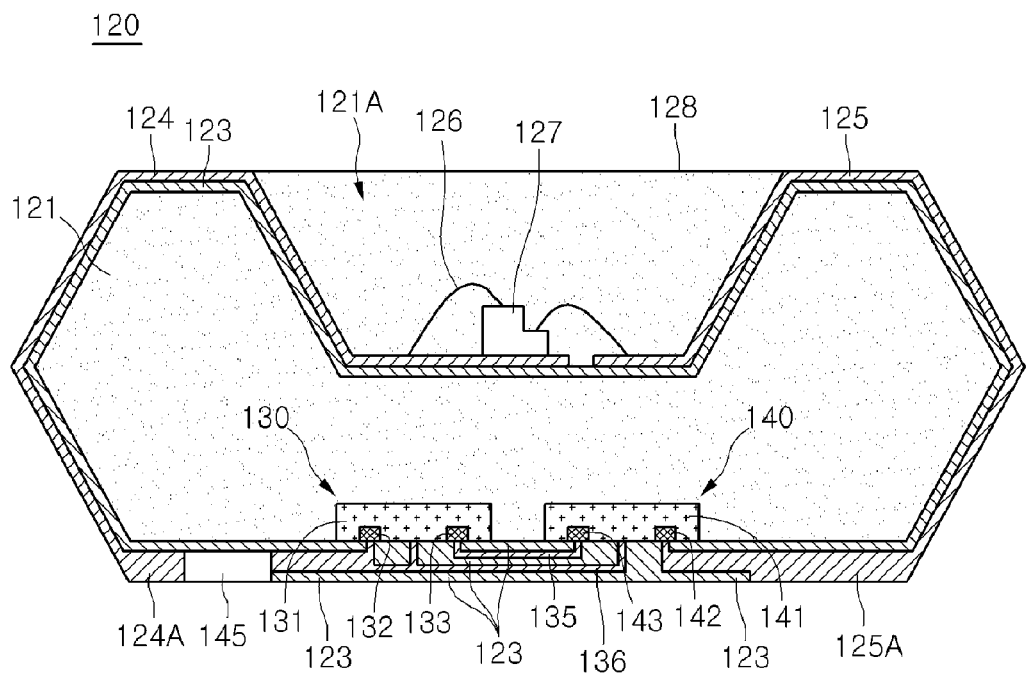
FIG. 4 is a sectional view of a light emitting device in which the constant current circuit of FIG. 3 is integrated.
Figure 5:
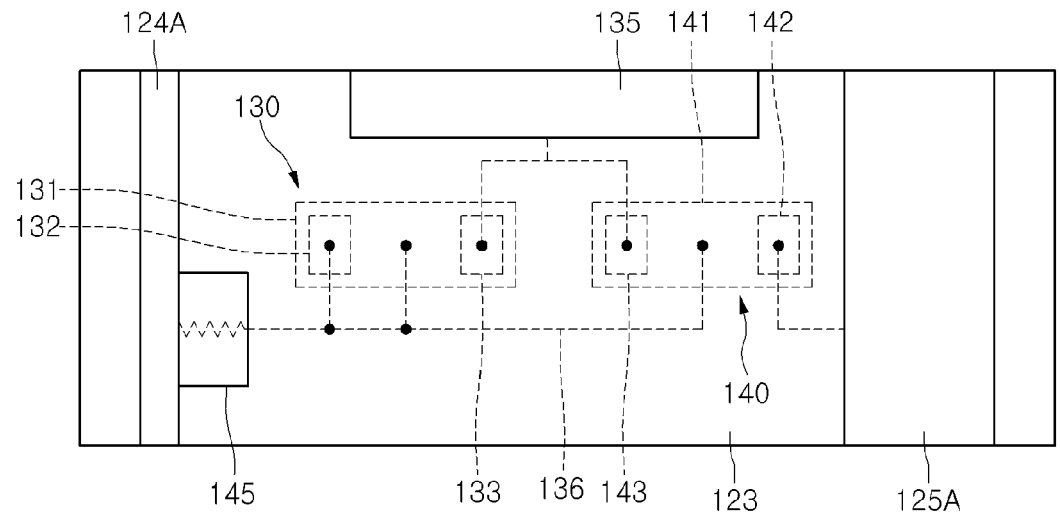
FIG. 5 is a schematic bottom view of a package body of FIG. 4.

FIGS. 3 to 5 illustrate a third embodiment. FIG. 3 is a view illustrating a constant current circuit of a light emitting diode. FIG. 4 is a side-sectional view illustrating a light emitting device into which the circuit of FIG. 3 is integrated. FIG. 5 is a view schematically illustrating the rear surface of FIG. 4.

Referring to FIG. 3, a constant current circuit 120A may be connected to the both ends of the light emitting diode 127, and may serve as a current mirror circuit. The constant current circuit 120A controls an input power source Vcc and thus allows a constant current to flow in the light emitting diode 127.

A first current I1 and a second current I2 that are inputted to the constant current circuit 120A flow at the same level. The first current I1 flows to a first transistor T1 through a first resistor R1, and the second current I2 flows to the second transistor T2 through the light emitting diode 127. The first and second currents I1 and I2 flow at the same level by a current mirror circuit. Accordingly, an almost level of current I2 flows in the light emitting diode 127 by the resistor R1 and the second transistor T1.

The value of the resistor R1 may have the substantially same value as a value that applies across the both ends of the light emitting diode 127. The resistor R1, for example, may be implemented, and its material may be formed of a resistor or metal nitride (for example, TaN), but is not limited thereto. The poly silicon resistor may be controlled a resistance value by conditions such as the amount of impurities diffused.

The first and second transistors T1 and T2 may be implemented as an NPN FET, and the FET may be implemented as a Junction FET (JFET) and a Metal Oxide Semiconductor FET (MOSFET). When the driving of a high current is required, the JFET may drive the light emitting diode 127 using a high power, and the MOSFET may drive the light emitting diode 127 using a low current. Alternatively, the first and second transistors T1 and T2 may be implemented as a PNP transistor, but is not limited thereto.

The gates of the first and second transistors T1 and T2 are connected to the resistor R1, and the sources of the first and second transistors T1 and T2 are connected to a ground terminal.

A current mirror circuit including the first and second transistors T1 and T2 allows a current flowing in a load (i.e., 127) and a current flowing through the resistor R1 to have the same value. The brightness change and light intensity deviation of light emitted from the light emitting diode 127 may decrease by a constant current that is supplied to the light emitting diode 127.

Referring to FIGS. 4 and 5, the light emitting device 120 includes a package body 121 with a cavity 121A, an insulating layer 123, a first doping region 130, a second doping region 140, a plurality of electrode layers 124 and 125, a light emitting diode 127, and a resin material 128.

The package body 121 may be formed of a silicon material, and the silicon material may be a first conductive type substrate. When the first conductive type is N-type, the package body 121 may be an N-type silicon substrate. For convenience of explanation, it will be assumed that the first conductive type is N-type, and the second conductive type is P-type.

The cavity 121A may be defined as an open region having a predetermined depth in an upper portion of the package body 121, and may have a circular or polygonal shape. The circumference of the cavity 121A may be inclined with respect to the bottom surface of the cavity 121A, but is not limited thereto. The bottom surface and circumference of the cavity 121A may vary with the light extraction efficiency.

An insulating layer 123 is disposed on the surface of the package body 121, and the insulating layer 123 may be formed of $SiO_2$, $Si_3N_4$, AlN, $Al_2O_3$, or $TiO_2$, but is not limited thereto.

A plurality of electrode layers 124 and 125 are disposed on the insulating layer 123. The plurality of electrode layers 124 and 125 are electrically separated from each other. The plurality of electrode layers 124 and 125 may be selectively formed of Cr, Ta, Ti, Cu, Ni, and Au, and may be formed in a single or multi-layer.

A light emitting diode 127 is attached to the first electrode layer 124, and the light emitting diode 127 is electrically connected to the plurality of electrode layers 124 and 125 by a wire 126. The light emitting diode 127 may be electrically connected to the plurality of electrode layers 124 and 125 using at least one of other connection methods such as wire method, flip method, or die junction method, but is not limited thereto.

At least one light emitting diode 127 may be disposed in the cavity 121A, but is not limited thereto.

A first doping region 130 and a second doping region 140 may be integrated in the package body 121. The first and second doping regions 130 and 140, which are transistor regions, may be disposed to be spaced apart from each other in the package body 121.

Referring to FIGS. 3 and 4, the first doping region 130 and the second doping region 140 may be integrated in the package body 121.

The first doping region 130 includes a first well 131 of the second conductive type, a second well 132 of the first conductive type in the first well 131 of the second conductive type, and a third well 133 of the first conductive type. The second well 132 of the first conductive type is spaced from the third well 133 of the first conductive type in the first well 131 of the second conductive type. The first conductive type is a P-type region, and the second conductive type is an N-type region.

The second doping region 130 includes a first well 141 of the second conductive type, a second well 142 of the first conductive type in the first well 141, and a third well 143 of the first conductive type in the first well 141. The second well 142 of the first conductive type is spaced from the third well 143 of the first conductive type in the first well 141 of the second conductive type. The first conductive type is a P-type region, and the second conductive type is an N-type region.

The first conductive type wells 132, 133, 142 and 143 become an N-type diffusion region or injection region using a dopant group V in the package body 121. The second conductive type wells 131 and 141 become a P-type diffusion region or injection region using a dopant group III. The dopant group III may be implemented with a P-type dopant, and the dopant group V may be implemented with an N-type dopant.

A resistor layer 145 is disposed on a portion 124A of the first electrode layer 124, and the resistor layer 145 may be formed of a polysilicon resistor or a metal nitride on the insulating layer 123. The resistance value may vary with the length of the resistor layer 145, but is not limited thereto.

The resistor layer 145 may be exposed to the outside as shown in FIG. 5, but is not limited thereto.

The first and second wells 131 and 132 of the first doping region 130 are connected to the output terminal of the resistor layer 145, and the second well 133 is connected to the third electrode layer 135. The first to third wells 131 to 133 of the first doping region 130 are implemented with a first element part, for example, a first transistor (e.g., JFET) of the NPN type.

The third electrode layer 135 may be disposed under the package body 121, and may have a lower potential than that of the first electrode layer 124 or the second electrode layer 125. For example, the third electrode layer 135 may serve as a ground terminal. Here, the ground terminal GND may be configured at the rear surface of the package body 121 using a separate terminal, or may be connected to a separate PCB.

The first well 141 of the second doping region 140 is connected to the output terminal of the resistor layer 145, and the second well 142 is connected to the cathode of the light emitting diode 127. The third well 143 is connected to the third electrode layer 135. The first to third wells 141 to 143 of the second doping region 140 are implemented with a second element part, for example, a second transistor (e.g., JFET) of the NPN type.

The conductive pattern 136 may connect the output terminal of the resistor layer 145, the first and second wells 131 and 132 of the first conductive region 130, and the first well 141 of the second doping region 140 to each other.

The insulating layer 123 may cover the undersurface of the first and second doping regions 130 and 140, and preventing unnecessary contact between the conductive pattern 136 and the pattern of the third electrode layer 135.

Also, an oxide (not shown) may be disposed on the surfaces of the first well 131 of the first doping region 130 and the first well 141 of the second doping region 140. The oxide layer may form a P-type well and a channel.

As shown in FIG. 5, the third electrode layer 135 may be disposed under the package body, but is not limited thereto. Also, the first and second doping regions 130 and 140 may be disposed adjacent to each other, but is not limited thereto.

In the above embodiments, the wells of the first and second doping region 130 and 140 has been described using NPN FET as an example, but may be implemented using PNP FET.

The light emitting device 120 may be realized by applying a diffusion process, an insulating process, an electrode formation process, and a resistor formation process to the package body 121. The manufacturing processes of the light emitting devices may include a Micro Electrical Mechanical System (MEMS) process or a silicon processing.

Figure 6:
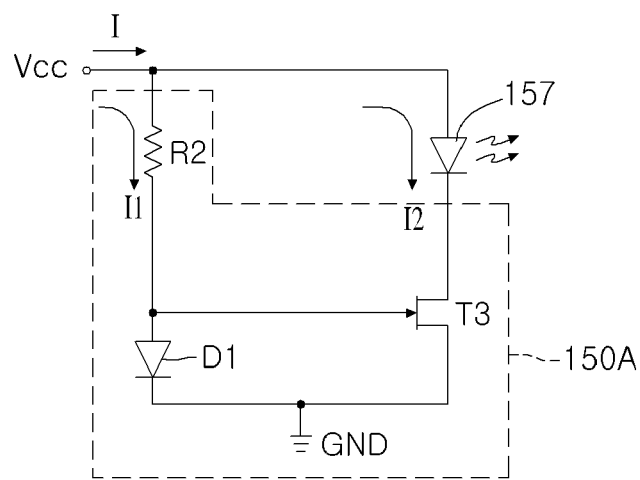
FIG. 6 is a view illustrating a constant current circuit of a light emitting device according to a fourth embodiment.
Figure 7:
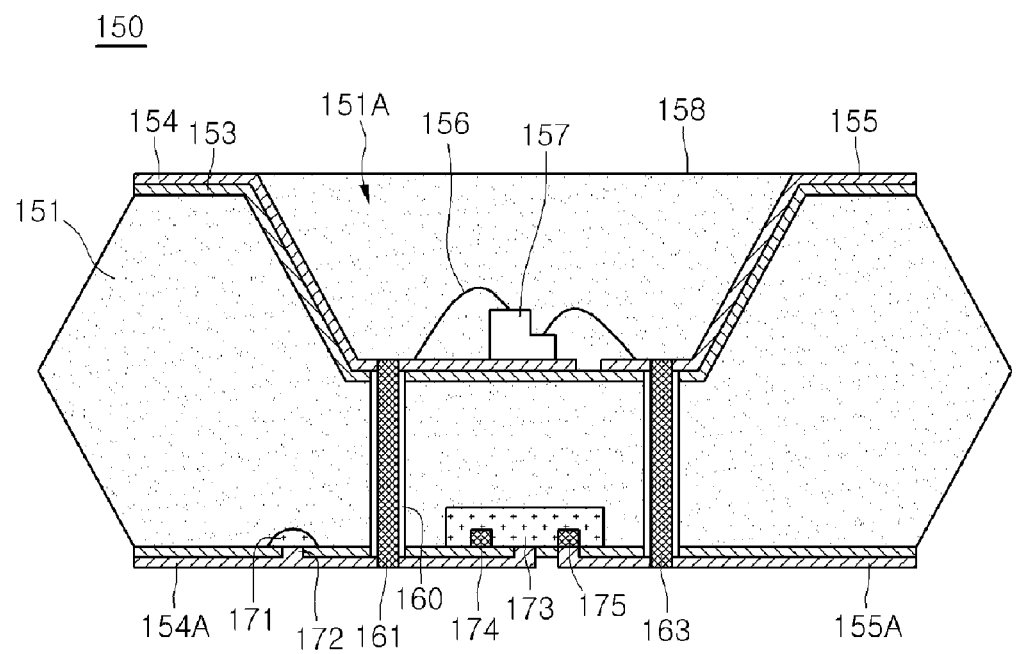
FIG. 7 is a sectional view of a light emitting device in which the constant current circuit of FIG. 6 is integrated.

FIGS. 6 and 7 correspond to a fourth embodiment. In describing the fourth embodiment, a description of an overlap with the third embodiment will be omitted for conciseness. The fourth embodiment is a modification of the first transistor of FIG. 3.

FIG. 6 is a view illustrating a constant current circuit of a light emitting diode according to a fourth embodiment, and FIG. 7 is a sectional view of a light emitting device in which the constant current circuit of FIG. 6 is integrated.

Referring to FIG. 6, a constant current circuit 150A may be connected to both ends of a light emitting diode (LED) 157 to serve as a current mirror circuit. The constant current circuit 150A controls an input power supply voltage Vcc to flow a constant current I2 through the light emitting diode 127.

The constant current circuit 150A includes a resistor R2, a diode D1, and a third transistor T3. In operation, a first current I1 is supplied through the resistor R2 to the diode D1 and the third transistor T3 and a second current I2 is supplied through the light emitting diode 157 to a drain terminal of the third transistor T3. That is, the second current I2, which has the same size as the first current I1 flowing through the resistor R2, flows through the light emitting diode 127 due to the current mirror characteristics.

The resistance of the second resistor R2 may be set according to the current flowing through the light emitting diode 157. The second resistor R2 may be formed of a polysilicon resistor or a metal oxide layer. If the second resistor R2 is formed of a polysilicon resistor, its resistance may be controlled by the condition such as the amount of diffused impurity. Also, the second resistor R2 may be formed in the shape of a strip line.

A current I diverges into the paths of the first current I1 and the second current I2. The first current I1 flows to a ground terminal through the second resistor R2 and the diode D1. The diode D1 may be implemented using a PN junction diode. The second current I2 flows to a ground terminal GND through the light emitting diode 157 and the third transistor T3. The third transistor T3 may be implemented using an NPN FET. Herein, an output terminal of the resistor R2 is connected to a gate terminal of the third transistor T3, and the third transistor T3 is driven by the power voltage applied through the path of the first current I1, thus turning on the light emitting diode 157.

The diode D1 is turned on by a predetermined voltage or more. Even when a predetermined voltage or more is applied to the third transistor T3, a constant current flows through a drain terminal of the third transistor T3. Accordingly, by the third transistor T3, a constant current flows through the light emitting diode 157.

The third transistor T3 may be implemented using an NPN or PNP type FET. The FET may be implemented using not only a Junction FET (JFET) but also a Metal Oxide Semiconductor FET (MOSFET). Herein, the JFET may drive a high-power LED for a large-current operation and the MOSFET may drive a small-current LED.

A current mirror circuit with the third transistor T3 controls the second current I2 flowing through the load (i.e., the LED) and the first current I1 flowing through the second resistor R2. Accordingly, the constant current circuit 150A controls a constant current to flow through the light emitting diode 157, thus reducing the light intensity deviation and the brightness change of the light emitting diode 157.

Referring to FIG. 7, the light emitting device 150 has a structure in which the light emitting package of FIG. 4 is changed into a different shape. That is, a through hole structure is provided within the package body 151.

The package body 151 includes a cavity 151A. A first insulating layer 153 is disposed on a top surface of the package body 151. A second insulating layer 153 is disposed on a bottom surface of the package body 151. A first electrode layer 154 and a second electrode layer 155 are disposed on the first insulating layer 153.

The light emitting diode 157 is adhered to the first electrode layer 154. The light emitting diode 157 may be electrically connected to the first and second electrode layers 154 and 155 using a wire 156.

A light transmission resin material 158 is filled into the cavity 151A. The resin material 158 may include silicon or an epoxy resin. A phosphor may be added to the resin material 158. A lens (not shown) may be disposed on or attached to the resin material 158.

The second insulating layer 153A is disposed under the package body 151, fourth and fifth electrode layers 154A and 155A are disposed under the second insulating layer 153A.

The package body 151 includes a plurality of through holes 161 and 163. The first through hole 161 has both ends respectively connected to the first electrode layer 154 and the fourth electrode layer 154A. The second through hole 163 has both ends respectively connected to the second electrode layer 155 and the fifth electrode layer 155A. The first and second through holes 161 and 163 may be isolated from the inside of the package body 151 by an insulating layer.

A second conductive type fourth well 171 is disposed under the package body 151. The fourth well 171 is connected to the first electrode layer 154A through a hole 172 defined in the second insulating layer 153A and realized as a doping region of a P-type dopant. The second conductive type fourth well 171 and the package body 151 are element parts. For example, the second conductive type fourth well 171 and the package body 151 may be realized as a PN junction diode. The PN junction diode may be realized by forming the P-type well and an N-type well within the P-type well, but is not limited thereto.

The package body 151 includes a different doping region in a lower portion thereof. A second conductive type first well, a first conductive type second well 174, and first conductive third well 175 are disposed in the doping region. The first well 173, the second well 174, and the third well 175 are element parts. For example, the first well 173, the second well 174, and the third well 175 may be realized as an NPN type third transistor (e.g., JFET).

A cathode of the PN junction diode and a source of the NPN transistor are grounded. Here, a third electrode layer may be disposed on a lower portion of the package body, and the third electrode layer may be connected to the package body and the third well 175. Also, the third electrode layer may function as a ground terminal.

A resistor layer may be disposed between the fourth electrode layer 154A and the fourth and first wells 171 and 173 of the second conductive type, and this technical property will be referred to FIG. 4.

In the fourth embodiment, a constant current circuit in which the PN junction diode and the NPN junction transistor are integrated with the package body 151 may be realized to regularly control current supplied into the light emitting diode 157. Also, the circuit diagram may be formed on the package of FIG. 7, but is not limited thereto.

Figure 8:
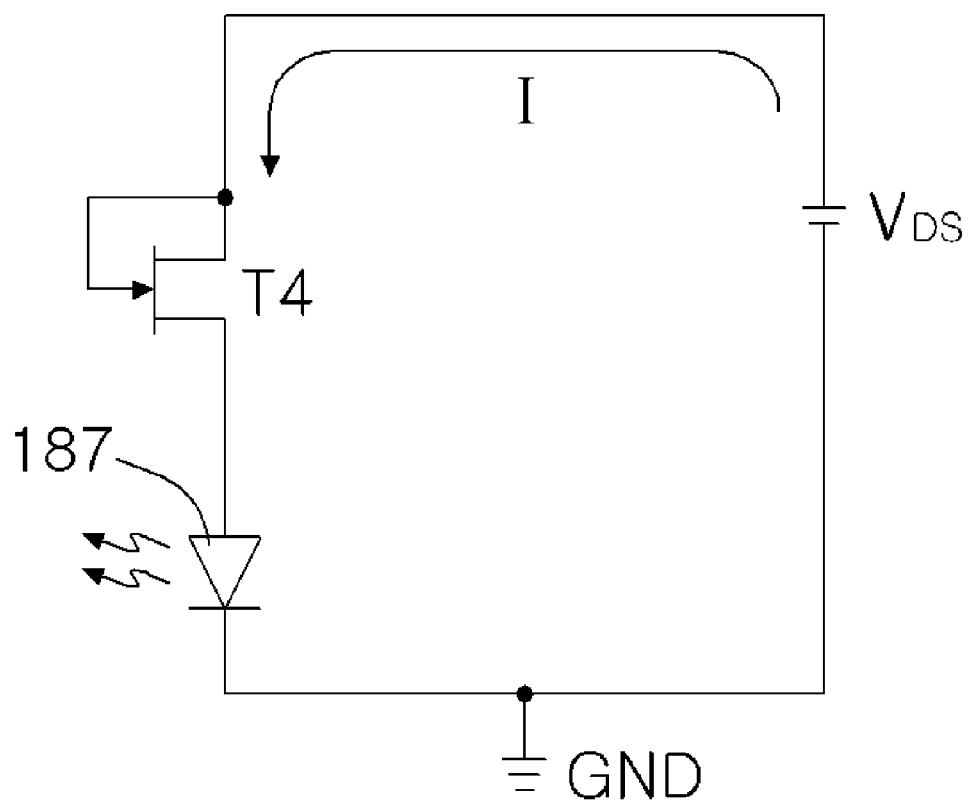
FIG. 8 is a view illustrating a constant current circuit of a light emitting device according to a fifth embodiment.
Figure 9:
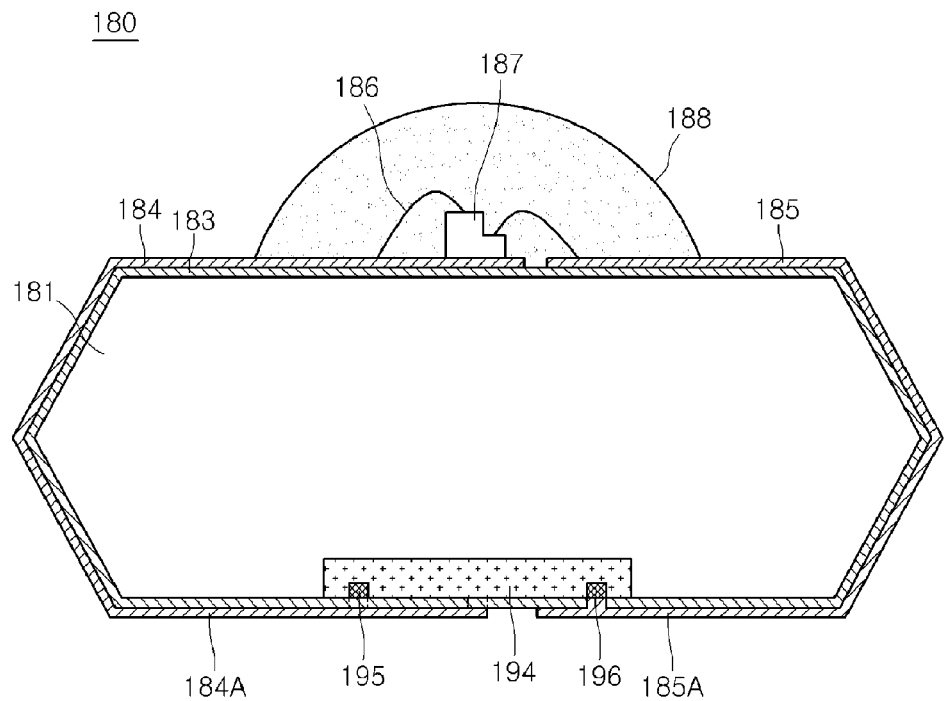
FIG. 9 is a sectional view illustrating a light emitting device in which a constant current circuit of FIG. 8 is integrated.

FIGS. 8 and 9 illustrate a fifth embodiment. FIG. 8 is a view illustrating a constant current circuit of a light emitting device according to a fifth embodiment, and FIG. 9 is a sectional view illustrating a light emitting device in which a constant current circuit of FIG. 8 is integrated. In descriptions of the fifth embodiment, the same parts as those of the third embodiment will be referred to the third embodiment, and their duplicated descriptions will be omitted.

Referring to FIG. 8, a constant current circuit has a structure in which a source of a fourth transistor T4 is connected to an anode of a light emitting diode 187. A drain of the fourth transistor T4 is connected to a power source VDS and connected to a gate thereof. The anode of the light emitting diode 187 is connected to the source of the fourth transistor T4. A ground terminal GND is connected to a cathode of the light emitting diode 187. The fourth transistor T4 may be realized as an NPN type JEET or MOSFET. Alternatively, the fourth transistor T4 may be realized as a PNP type.

The fourth transistor T4 is turned on by the power source VDS inputted into the drain and the gate to flow current I into the light emitting diode 187.

Referring to FIG. 9, a light emitting device 180 includes the package body 171 in which the cavity is not provided. The light emitting diode 187 is mounted on the package body 171, and a resin material 188 is molded. The resin material 188 has a hemisphere shape or polygonal shape.

A doping region is defined in a lower portion of the package body 181. A second conductive type first well 194 is disposed in the doping region. A first conductive type second well 195 and third well 196 are disposed within the second conductive type first well 194. The first well 194, the second well 195, and the third well 196 may be realized as an NPN type fourth transistor. The first conductive type third well 196 is connected to a portion 185A of the second electrode layer 185, and the second electrode layer 185 is electrically connected to the cathode of the light emitting diode 187. A separate ground terminal may be realized on the package body 181, but is not limited thereto.

Thus, in the package body 181, an NPN FET is integrated on a path through which current is supplied into the light emitting diode 187. The respective features of the embodiments are applicable to other embodiments within technical range of the embodiments, but are not limited thereto. For example, the transistor may be realized as the PNP type JJFET or MOSFET.

FIGS. 10 to 19 are views illustrating a process of manufacturing a light emitting device according to a sixth embodiment.

Figure 10:
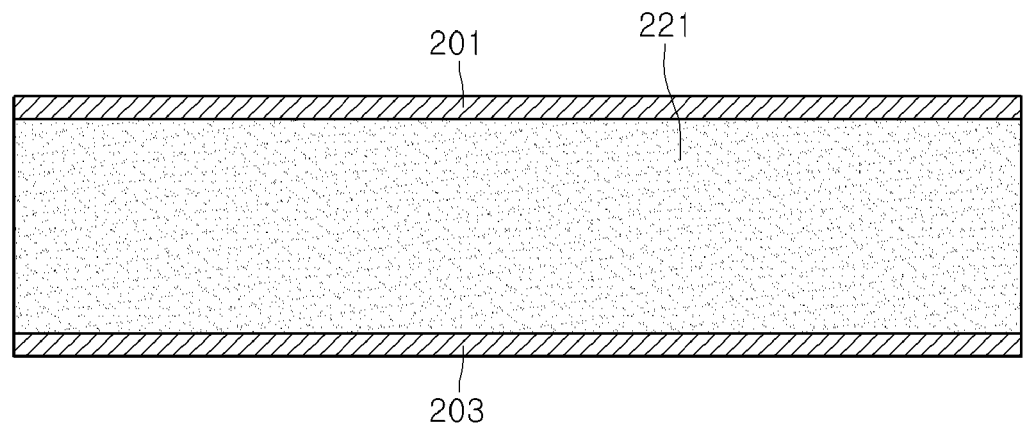
FIGS. 10 to 19 are views illustrating a process of manufacturing a light emitting device according to a sixth embodiment.
Figure 11:
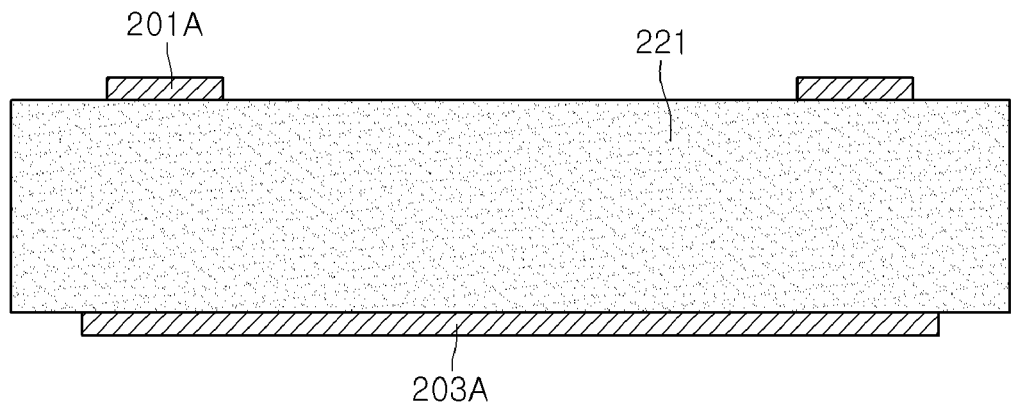

Referring to FIGS. 10 and 11, a silicon substrate may be used as a package body 221. Mask layers 201 and 203 are formed on and under the silicon substrate. A first etching process is performed to form mask patterns 201A and 203A. For example, the mask layers 201 and 203 may be formed of silicon nitride. A dry etching process may be used as the first etching process.

Figure 12:
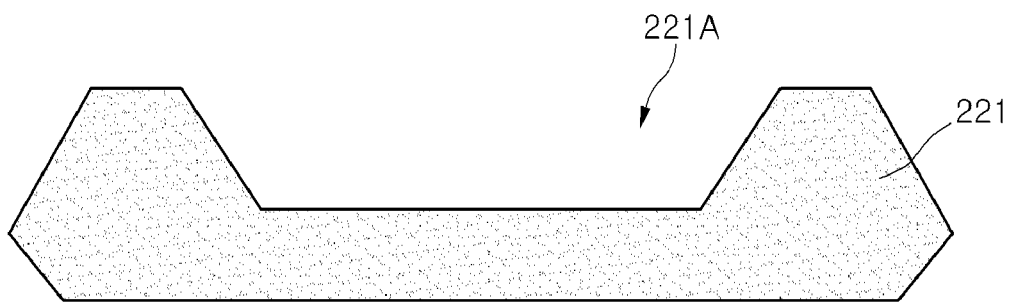

Referring to FIGS. 11 and 12, a second etching process is performed on the package body 221 except the mask patterns 201A and 203A. The second etching process is performed on the package body 221 to form a cavity 221A having a predetermined depth in a top surface of the package body 221. Also, a circumference of the package body 221 may be inclined in a multi-stage.

The package body 221 may have a structure inclined downward with respect to the top surface thereof and a structure upward with respect to a bottom surface thereof.

A wet etching or/and dry etching processes may be used as the second etching process, but is not limited thereto. For example, an anisotropic wet etching solution such as a KOH solution, TMAH, or EDP may be used as the wet etching solution.

The cavity 221A may have any one of a base tube-shaped groove, a polygonal groove, or a circular groove, but is not limited thereto.

Figure 13:
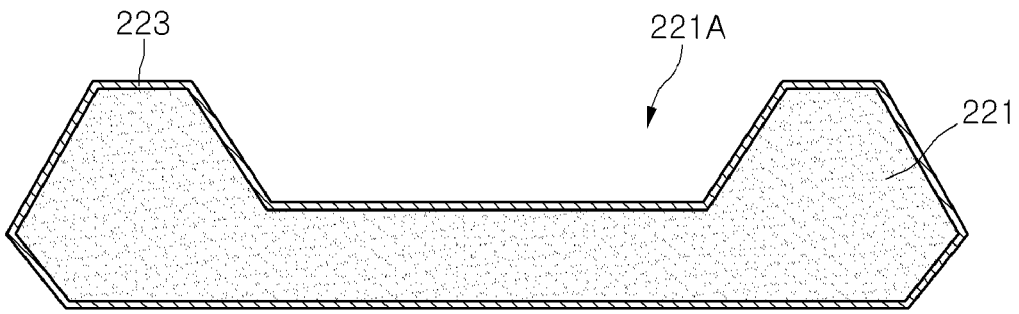

Referring to FIGS. 12 and 13, an insulating layer 223 is formed on a surface of the package body 221. An etching process may be performed on a bottom surface of the package body 221 to remove a portion of the insulating layer 223, thereby opening a doping region. Alternatively, the insulating layer 223 may not be formed.

Figure 14:
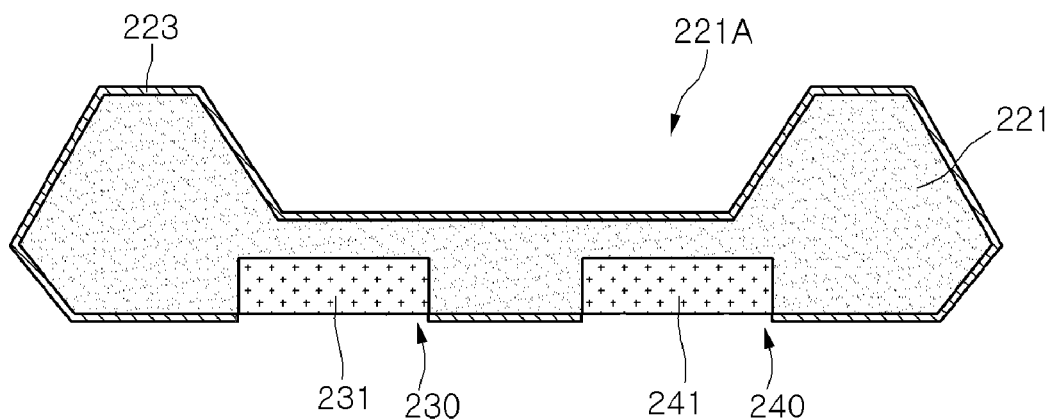

Referring to FIGS. 13 and 14, a plurality of doping regions 230 and 240 is defined in a lower portion of the package body 221. First wells 231 and 241 are formed using a group-III dopant in the respective doping regions 230 and 240. A diffusion process or ion implantation process may be performed using group-III dopant to form the first wells 231 and 241. The plurality of first wells 231 and 241 are spaced apart from each other. The first wells 231 and 241 may be formed using a dopant having a polarity opposite to a semiconductor polarity of the package body 221.

Figure 15:
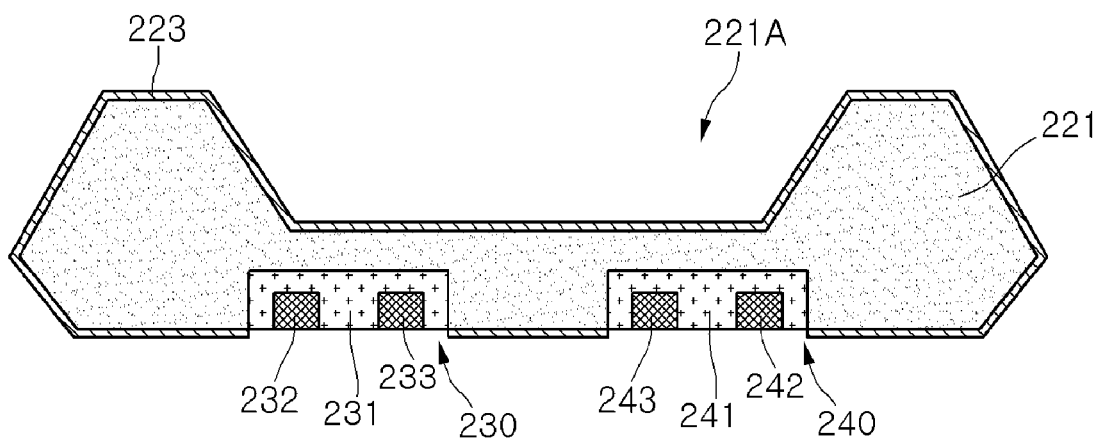

Referring to FIGS. 14 and 15, a second conductive type second well 232 and a second conductive type third well 233 are formed within the first well 231 of the first doping region 230. The second well 232 and the third well 233 are spaced apart from each other. A second conductive type second well 242 and a second conductive type third well 243 are formed within the first well 241 of the second doping region 240. The second well 242 and the third well 243 are spaced apart from each other. The second wells 232 and 242 and the third wells 233 and 243 may be formed by ion-implanting or diffusing a V-group dopant.

The diffusion process is performed two times to form the well region. The first diffusion process is performed to form the first wells 231 and 241 having a polarity opposite to that of the package body 221, and the second diffusion process is performed to form the second wells 232 and 242 and the third wells 233 and 243 within the first wells 231 and 241. Although two doping regions 230 and 240 are defined in the package body 221 in the present embodiment, the present disclosure is not limited thereto. For example, two or more doping regions may be defined in the package body 121, but is not limited thereto.

Figure 16:
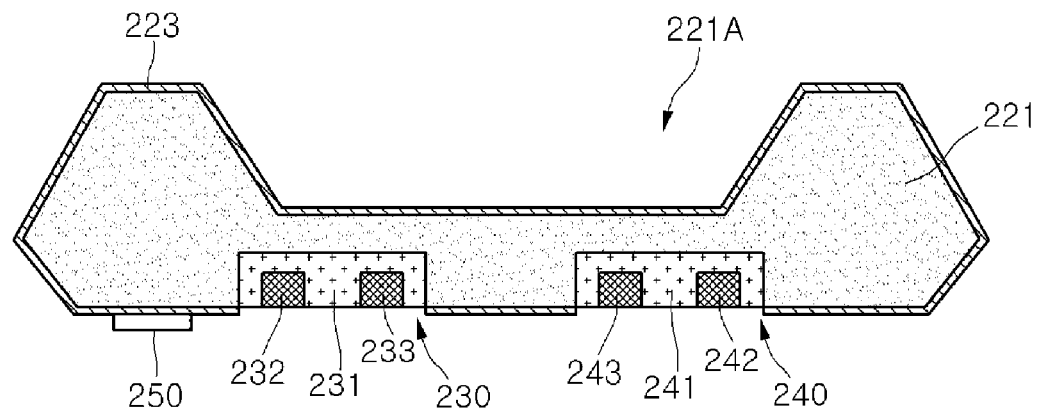

Referring to FIGS. 15 and 16, a resistor layer 250 may be formed on a bottom surface of the package body 221. The resistor layer 250 may be formed on the bottom surface of the package body 221 or on an insulating layer 223.

The resistor layer 250 may be realized as a semiconductor thin film resistor. The resistor layer 250 may be formed of metal nitride (e.g., TaN), polysilicon, or other semiconductor resistor. The resistor formation process may be performed after the formation of the electrode layer, but is not limited thereto.

Figure 17:
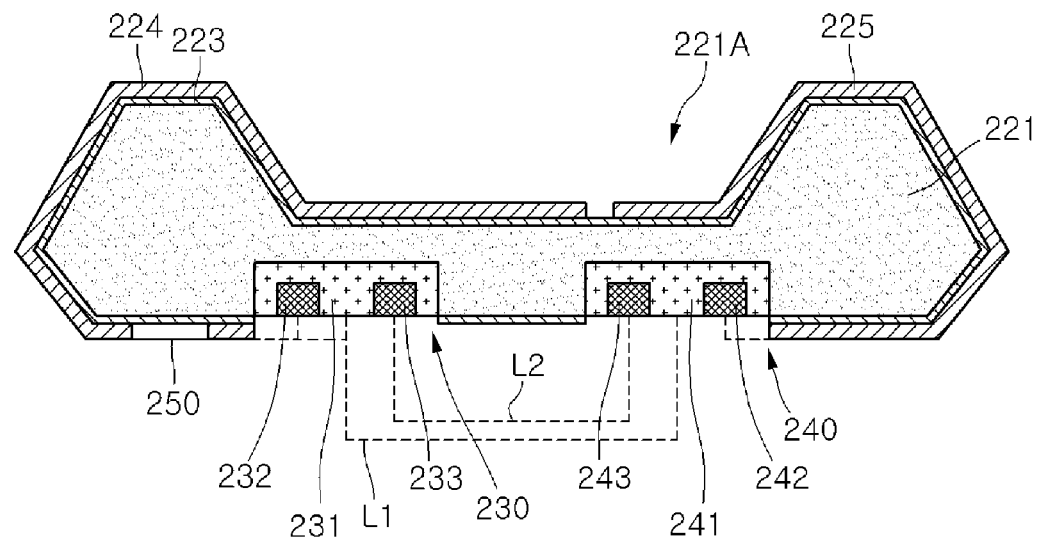

Referring to FIGS. 16 and 17, a first electrode layer 224 and a second electrode layer 225 are formed on an insulating layer 223 of the package body 221. The first and second electrode layers 224 and 225 may be formed of Cr, Ta, Ti, Cu, Ni, or Au. Also, the first and second electrode layers 224 and 225 may be formed in a single or multi-layer. The first electrode layer 224 and the second electrode layer 225 may be electrically separated from each other.

A highly reflective metal may be disposed on portions of the first and second electrode layers 224 and 225. For example, the electrode layers 224 and 225 of the cavity region may be formed of a highly reflective metal or alloy such as Al, Ag, or APC (Al+Pd+Cu) metal. The highly reflective metal may improve light reflection efficiency in the cavity region. Also, a metal such as Au or Cu may be formed in a region in which the light emitting diode will be mounted. Also, a metal may be deposited in the cavity region in consideration of an adhesion force with a silicon material formed in a package process.

The first electrode layer 224 and the second electrode layer 225, which are disposed on a lower portion of the package body 221 may contain a metal electrically/mechanically connected to a metal line formed on a PCB (Printed circuit board) in a surface mount technology process, e.g., Au or Cu. That is, a cream solder, an adhesive, or other metal having superior adhesion force may be formed on portions of the first electrode layer 224 and the second electrode layer 225.

In the formation of the electrode layers 224 and 225, the wells 231, 232, and 233 of the first doping region 230, the wells 241, 242, 243 of the second doping region 240, and the resistor layer 250 may be connected to each other as the circuit diagram of FIG. 3. Here, conductive patterns L1 and L2 may connect the components to each other or be serve as a ground terminal.

Also, an insulating layer formation process may be additionally performed before or after the formation of the electrode layers 224 and 225, but is not limited thereto.

Figure 18:
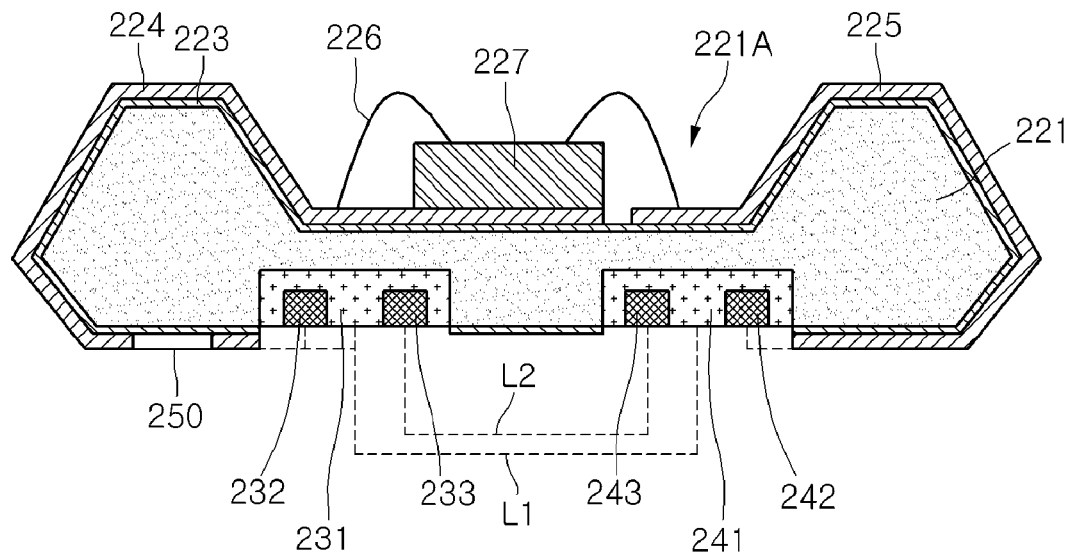

Referring to FIGS. 17 and 18, a light emitting diode 240 is attached to a top surface of the first electrode layer 224 in the cavity 221A of the package body 221. Here, the light emitting diode 227 may be connected to the plurality of electrode layers 224 and 225 through a wire 226 or electrically connected to the plurality of electrode layers 224 and 225 using at least one wire, flip scheme, or a die bonding scheme.

Figure 19:
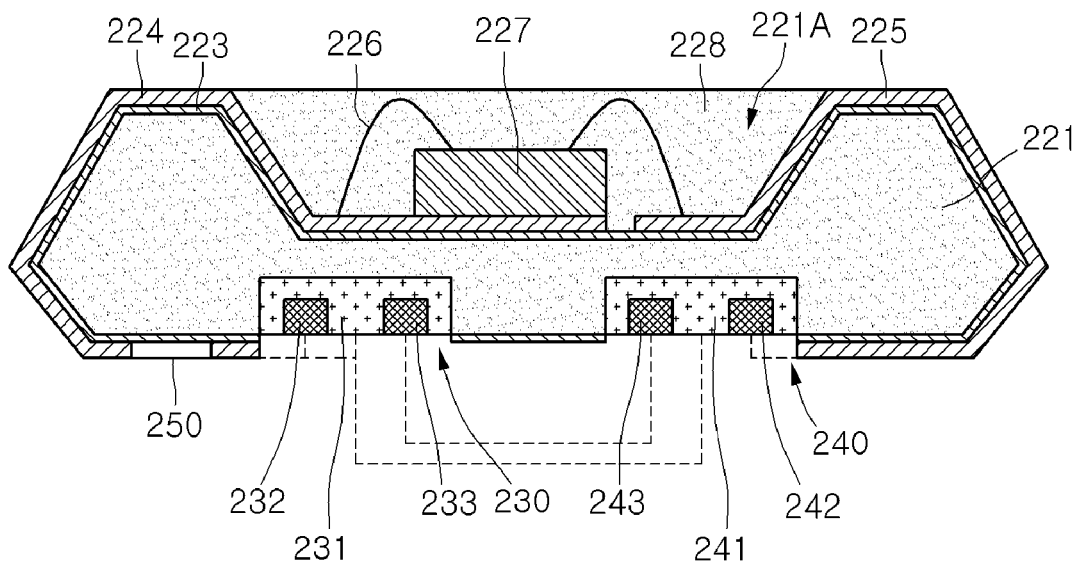

Referring to FIGS. 18 and 19, a resin material 228 is formed in the cavity 221A of the package body 221. A light transmission epoxy or silicon material may be used as the resin material 228. At least one phosphor may be added to the resin material 228. A lens may be further formed on the resin material 228.

The light emitting device 200 realizes a transistor in the plurality of doping region and forms the resistor layer having a thin film shape. Thus, the light emitting device 200 may include a constant current circuit for protecting the light emitting diode.

The method of manufacturing the light emitting device according to the embodiment includes forming an insulating layer on a first conductive type package body; forming at least one second conductive type first well in the package body; forming a first conductive type second and third wells within the second conductive type first well; forming a resistor layer below the package body; forming a plurality of electrode layers on the insulating layer; selectively connecting the plurality of electrode layers, the first conductive type first well, the second conductive type second and third wells, and the resistor layer to each other; and electrically connecting a light emitting diode to the plurality of electrode layer.

Figure 20:
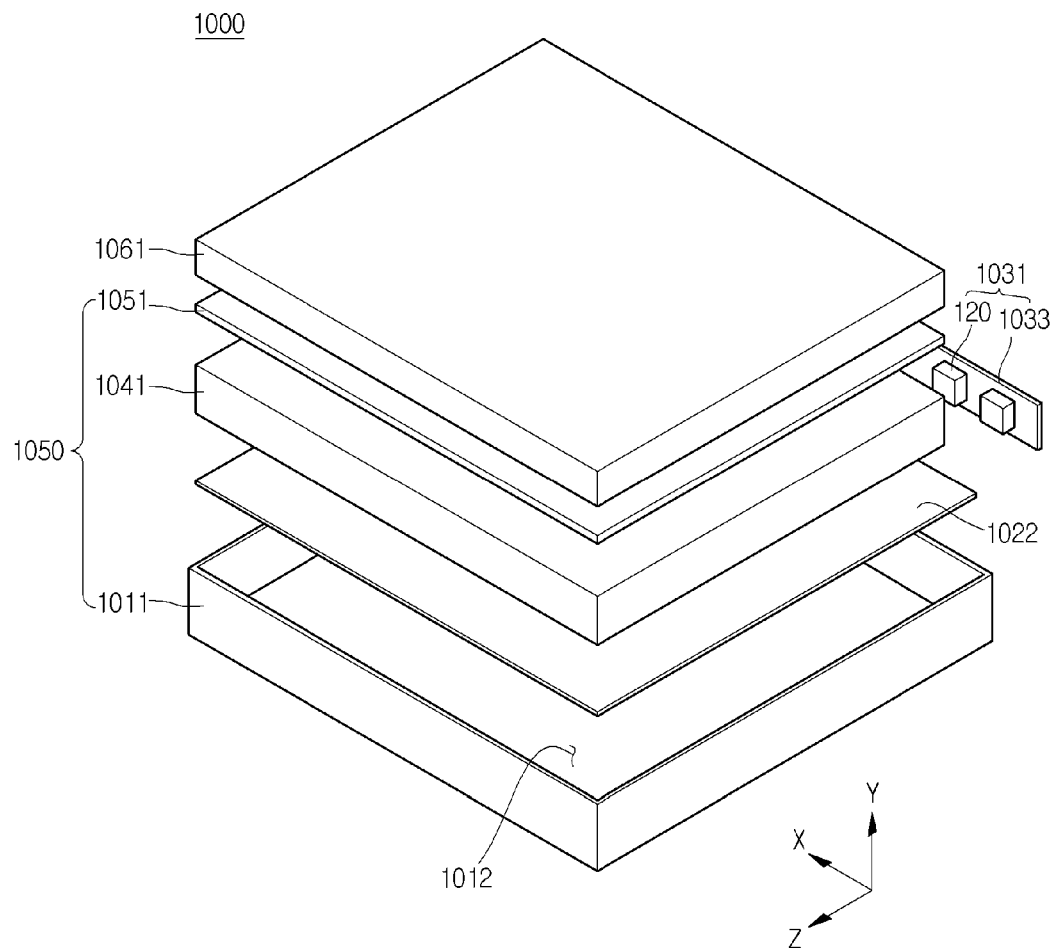
FIG. 20 is a view of a display unit according to an embodiment.

FIG. 20 is a view of a display unit according to an embodiment.

Referring to FIG. 20, a display unit 1000 may include a light guide plate 1041, a light emitting module 1031 providing light to the light guide plate 1041, a reflective member 1022 below the light guide plate 1041, an optical sheet 1051 on the light guide plate 1041, a display panel 1061 on the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041 may be defined as the lighting unit 1050.

The light guide plate 1041 diffuses light to provide a surface light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 provides light to at least one surface of the light guide plate 1041. Thus, the light emitting module 1031 may be used as a light source of a display device.

At least one light emitting module 1031 may be provided to directly or indirectly provide light on a lateral surface of the light guide plate 1041. The light emitting module 1031 may include a board 1033 and the light emitting device 120 according to the embodiment. The light emitting device 120 may be arrayed by a predetermined distance on the board 1033.

The board 1033 may be a PCB including a circuit pattern (not shown). However, the board 1033 may include a metal core PCB or a flexible PCB as well as the PCB, but is not limited thereto. When the light emitting device 120 are mounted on a lateral surface of the bottom cover 1011 or a heatsink plate, the board 1033 may be removed. Here, a portion of the heatsink plate may contact a top surface of the bottom cover 1011.

The plurality of light emitting device 120 may be mounted to allow a light emitting surface through which light is emitted onto the board 1033 to be spaced a predetermined distance from the light guide plate 1041, but is not limited thereto. The light emitting device 120 may directly or indirectly provide light to a light incident surface that is a side of the light guide plate 1041, but is not limited thereto.

The reflective member 1022 may be disposed under the light guide plate 1041. The reflective member 1022 reflects light incident onto a bottom surface of the light guide plate 1041 to proceed in an upward direction, thereby improving brightness of the backlight unit. For example, the reflective member 1022 may be formed of one of PET, PC, and PVC, but is not limited thereto. The reflective member 1022 may be a top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press forming process or an extrusion molding process. The bottom cover 1011 may be formed of a metal or non-metal having superior heat conductivity, but is not limited thereto.

For example, the display panel 1061 may be a liquid crystal display (LCD) panel, and include first and second substrates formed of a transparent material and a liquid crystal layer between the first and second substrates. A polarizing plate may be attached to at least one surface of the display panel 1061. The present disclosure is not limited to the attached structure of the polarizing plate. The display panel 1061 displays information by light passing through the optical sheet 1051. The display unit 1000 may be applied to various portable terminals, a monitor for a notebook computer, a monitor for a laptop computer, television, etc.

The optical sheet 1051 is disposed between the display panel 1061 and the light guide plate 1041 and includes at least one transmission sheet. For example, the optical sheet 1051 may include at least one of a diffusion sheet, a horizontal or vertical prism sheet, a bright enhancement sheet, etc. The diffusion sheet diffuses incident light, and the horizontal or/and vertical prism sheet collects the incident light into a display region. The bright enhancement sheet reuses lost light to improve brightness. Also, a protection sheet may be disposed on the display panel 1061, but is not limited thereto.

Here, an optical member such as the light guide plate 1041 and the optical sheet 1051 may be disposed on an optical path of the light emitting module 1031, but is not limited thereto.

Figure 21:
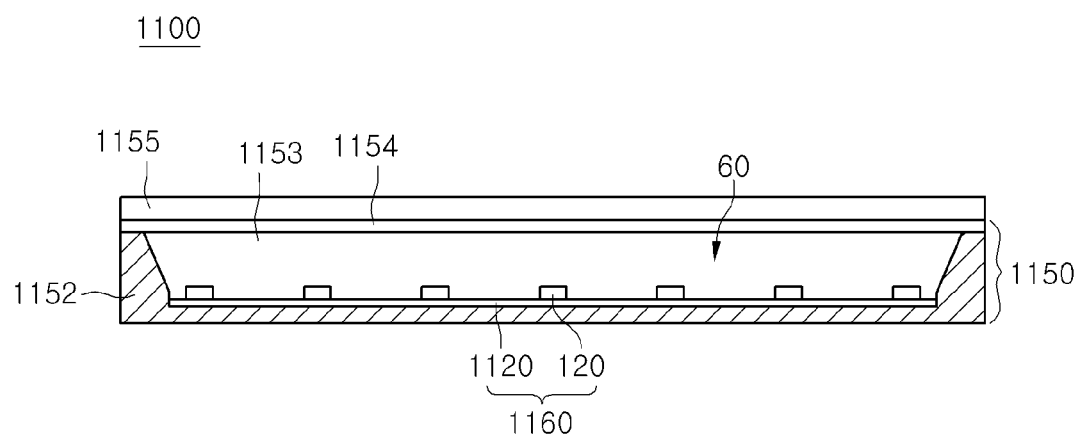
FIG. 21 is a view illustrating another example of a display unit according to an embodiment.

FIG. 21 is a view illustrating another example of a display unit according to an embodiment.

Referring to FIG. 21, a display unit 1100 includes a bottom cover 1152, a board 1120 on which the light emitting device 120 described above are arrayed, an optical member 1154, and a display panel 1155.

The bottom cover 1152, the at least one light emitting module 1060, and the optical member 1154 may be defined as a lighting unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The bright enhancement sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 22:
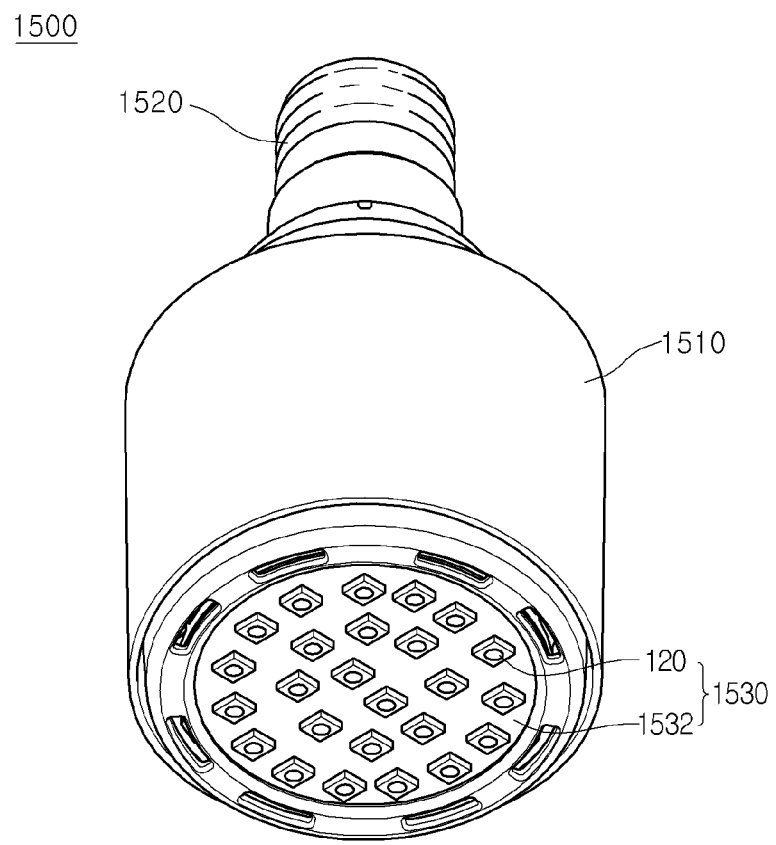
FIG. 22 is a view of a lighting unit according to an embodiment.

FIG. 22 is a perspective view of a lighting unit according to an embodiment.

Referring to FIG. 22, the lighting unit 1500 may include a case 1510, a light emitting module 1530 in the case 1510, and a connection terminal 1520 disposed in the case 1510 to receive an electric power from an external power source.

The case 1510 may be preferably formed of a material having good heat shielding characteristics, for example, a metal material or a resin material.

The light emitting module 1530 may include a board 1532 and a light emitting device 120 mounted on the board 1532. The light emitting device 120 may be provided in plurality, and the plurality of light emitting device 120 may be arrayed in a matrix shape or spaced a predetermined distance from each other.

The board 1532 may be an insulator substrate on which a circuit pattern is printed. For example, the board may include a general printed circuit board (PCB), a metal core PCB, a flexible PCB, a ceramic PCB, etc.

Also, the board 1532 may be formed of a material to efficiently reflect light, and a surface thereof may be formed in a color capable of efficiently reflecting light, for example, white color, or silver color.

The at least one light emitting device 120 may be mounted on the board 1532. Each of the light emitting device 120 may include at least one light emitting diode (LED) chip. The LED chip may include a color LED emitting red, green, blue or white light, and a UV LED emitting ultraviolet (UV) rays.

The light emitting module 1530 may have a combination of several light emitting device packages to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

Embodiments integrate the constant current circuit with the package body to provide the package having the constant current circuit and miniaturize the LED module. Also, in the light emitting device according to the embodiment, since the constant current may be supplied to the LED chip, a price of the light source module may be reduced. Embodiments may reduce the number of parts to be mounted on the light source module.

The package according to the embodiments may be used as light sources for display devices, indicating devices, communication devices, terminals, and illumination fields.

The characteristics, structures, and effects described above are included in at least one embodiment and are not limited to only one embodiment. Furthermore, it will be understood by those of ordinary skill in the art that various changes in form and details may be made therein without departing from the spirit and scope of the present invention as defined by the following claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a package body;
   an insulating layer on a surface of the package body;
   first and second electrode layers on the insulating layer, the first and second electrode layers being spaced apart from each other;
   a light emitting diode disposed on the package body and electrically connected to the first and second electrode layers;
   a resistor layer connected to the first electrode layer;
   a first element part in a first doping region within the package body, the first element part being connected to the resistor layer to output a power source inputted from the resistor layer;
   a second element part in a second doping region within the package body, the second element part being connected to the light emitting diode to output the power source inputted from the resistor layer; and
   a third electrode layer connected to the first element part and the second element part, the third electrode layer having an electric potential less than those of the first electrode layer and the second electrode layer,
   wherein the resistor layer is connected to the first element part and the second element part,
   wherein the second element part is connected to the first element part and the second electrode layer, and
   wherein the resistor layer is spaced apart from the second electrode layer and the third electrode layer.

2. The light emitting device according to claim 1, wherein the first and second element parts comprise transistors, respectively.

3. The light emitting device according to claim 2, wherein the first element part comprises:
   a second conductive type first well in the first doping region within the package body; a first conductive type second well within the first well; and
   a first conductive type third well spaced apart from the second well within the first well, wherein the first and second wells of the first element part are connected to an output side a first portion of the resistor layer, and wherein the third well of the first element part is connected to the third electrode layer.

4. The light emitting device according to claim 3, wherein the first conductive type is a P-type well region, and the second conductive type is an N-type well region.

5. The light emitting device according to claim 2, wherein the second element part comprises:
a second conductive type first well in the second doping region within the package body; a first conductive type second well within the first well; and
a first conductive type third well spaced apart from the second well within the first well,
wherein the first well of the second element part is connected to a first portion of the resistor layer, and
wherein the second well of the second element part is connected to a cathode of the light emitting diode.

6. The light emitting device according to claim 2, wherein the third electrode layer comprises a ground terminal.

7. The light emitting device according to claim 1, wherein the first element part comprises a diode in which an anode is connected to a first portion of the resistor layer and a cathode is connected to the third electrode layer, and
wherein the second element part comprises a transistor.

8. The light emitting device according to claim 1, wherein the package body comprises a silicon substrate.

9. The light emitting device according to claim 1, further comprising a cavity having an opened upper side and a predetermined depth on the package body,
wherein the light emitting diode, a portion of the first electrode layer, and a portion of the second electrode layer are disposed on a bottom surface of the cavity.

10. The light emitting device according to claim 1, further comprising a resin material on the light emitting diode.

11. The light emitting device according to claim 10, wherein a phosphor is added to the resin material.

12. The light emitting device according to claim 1, wherein the light emitting diode is disposed on a top surface of the package body, and
wherein the first element part and the second element part are disposed on a surface opposite to the top surface of the package body.

13. A light emitting device comprising:
a conductive package body;
an insulating layer on a surface of the conductive package body;
first and second electrode layers on the insulating layer, the first and second electrode layers being spaced apart from each other;
a resistor layer disposed on the insulating layer, the resistor layer connected to the first electrode layer;
a first element part in a first doping region within the conductive package body, the first element part being connected to the resistor layer;
a second element part in a second doping region within the conductive package body, the second element part being connected to the first element part and a cathode of the light emitting diode; and
a light emitting diode disposed on the first electrode and connected to the first electrode layer and the second electrode layer,
wherein the second element part comprises a second conductive type first well connected to the light emitting diode, a first conductive type second well connected to the light emitting diode and a first conductive type third well connected to the third electrode layer,
wherein the second and third wells are electrically separated from each other within the first well,
wherein the resistor layer is connected to the first element part and the second element part,
wherein the second element part is connected to the first element part and the second electrode layer, and
wherein the resistor layer is spaced apart from the second electrode layer and the third electrode layer.

14. The light emitting device according to claim 13, wherein the second element part comprises an NPN or PNP type field effect transistor (FET).

15. The light emitting device according to claim 13, wherein a first portion of the resistor layer is connected to the first and second element parts.

16. The light emitting device according to claim 13, wherein the resistor layer comprises at least one of a metal nitride layer, a polysilicon resistor, a thermal resistor, and a strip line.

17. The light emitting device according to claim 13, wherein the resistor layer has a resistance substantially equal to that of both ends of the light emitting diode.

18. The light emitting device according to claim 17, wherein the first electrode layer and second electrode layer is disposed on a top and bottom surface of the conductive package body, and a third electrode layer is disposed on a bottom surface of the conductive package body, and
wherein the third electrode layer has an electrical potential less than the electrical potentials of the first and second electrode layers.

19. The light emitting device according to claim 13, wherein the light emitting diode includes a plurality of light emitting diodes disposed on the conductive package body.

* * * * *